United States Patent
Lee et al.

(10) Patent No.: US 9,294,702 B2
(45) Date of Patent: Mar. 22, 2016

(54) IMAGE SENSORS FOR PERFORMING THERMAL RESET, METHODS THEREOF, AND DEVICES INCLUDING THE SAME

(71) Applicants: Tae Yon Lee, Seoul (KR); Jung Kyu Jung, Seoul (KR); Yoon Dong Park, Osan-si (KR); Hyun Seok Lee, Hwaseong-si (KR)

(72) Inventors: Tae Yon Lee, Seoul (KR); Jung Kyu Jung, Seoul (KR); Yoon Dong Park, Osan-si (KR); Hyun Seok Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 197 days.

(21) Appl. No.: 14/074,035

(22) Filed: Nov. 7, 2013

(65) Prior Publication Data

US 2014/0151530 A1    Jun. 5, 2014

(30) Foreign Application Priority Data

Nov. 30, 2012 (KR) .......................... 10-2012-0137825

(51) Int. Cl.
*H01L 27/00* (2006.01)
*H04N 5/378* (2011.01)
*H04N 5/374* (2011.01)
*H04N 5/3745* (2011.01)

(52) U.S. Cl.
CPC ............... *H04N 5/378* (2013.01); *H04N 5/374* (2013.01); *H04N 5/3745* (2013.01); *H01L 2924/0002* (2013.01)

(58) Field of Classification Search
CPC ....................................................... H04N 5/378
USPC ...................................................... 250/208.1
See application file for complete search history.

(56) References Cited

U.S. PATENT DOCUMENTS

| | | | |
|---|---|---|---|
| 4,194,220 A | 3/1980 | Frame | |
| 6,326,610 B1 | 12/2001 | Muramatsu et al. | |
| 7,990,441 B2 | 8/2011 | Lee | |
| 2006/0044430 A1 | 3/2006 | Mouli | |
| 2007/0023614 A1 | 2/2007 | Park et al. | |
| 2008/0157141 A1* | 7/2008 | Han ............................. | 257/292 |
| 2009/0201228 A1 | 8/2009 | Kim et al. | |
| 2010/0097354 A1 | 4/2010 | Ahn et al. | |
| 2011/0168685 A1 | 7/2011 | Naidu et al. | |

FOREIGN PATENT DOCUMENTS

| | | |
|---|---|---|
| JP | 3957806 B2 | 8/2007 |
| JP | 4195396 B2 | 12/2008 |

* cited by examiner

*Primary Examiner* — Thanh Luu
(74) *Attorney, Agent, or Firm* — Harness, Dickey & Pierce, P.L.C.

(57) ABSTRACT

A method of operating an image sensor includes: thermoelectrically cooling a pixel using a thermoelectric element having a thermoelectric-junction integrated to the pixel; and performing a photoelectric conversion operation using the thermoelectric element. An image sensor includes a pixel and a readout circuit. The pixel includes a thermoelectric element having a thermoelectric-junction, and the readout circuit is configured to control the pixel such that the thermoelectric element performs a thermoelectric-cooling operation and a photoelectric conversion operation.

21 Claims, 15 Drawing Sheets

IMAGE SENSORS FOR PERFORMING THERMAL RESET, METHODS THEREOF, AND DEVICES INCLUDING THE SAME

CROSS-REFERENCE TO RELATED APPLICATIONS

This application claims priority under 35 U.S.C. §119 to Korean Patent Application No. 10-2012-0137825, filed on Nov. 30, 2012, in the Korean Intellectual Property Office (KIPO), the entire contents of which are incorporated herein by reference.

BACKGROUND

1. Field

Example embodiments of the present inventive concepts relate to image sensors, and more particularly to image sensors capable of performing a thermal reset using the Peltier effect, operation methods thereof, and devices including image sensors.

2. Description of Conventional Art

A CMOS image sensor is a solid-state image sensing device using a complementary metal-oxide semiconductor (CMOS). The CMOS image sensor has lower manufacturing costs and a smaller size than a charge coupled device (CCD) image sensor including a high voltage analog circuit, so that the CMOS image sensor consumes less power.

In recent years, as the CMOS image sensor has improved in performance, the CMOS image sensor has been widely used in various electronic products besides a portable electronic device such as a smart phone or a digital camera

SUMMARY

An example embodiment of the present inventive concepts is directed to a method of operating an image sensor. According to this example embodiment, the method includes: thermoelectrically cooling a pixel using a thermoelectric element having a thermoelectric junction integrated with the pixel; and performing a photo-electric conversion operation using the thermoelectric element. The thermoelectric-cooling may include Peltier-cooling the pixel using a Peltier-element having a Peltier-junction.

The Peltier-cooling may include: supplying a first voltage to an n-type semiconductor element forming the Peltier-junction during a reset operation; and supplying an operation voltage, which is higher than the first voltage, to a p-type semiconductor element forming the Peltier-junction while supplying the first voltage to the n-type semiconductor element during the reset operation.

The p-type semiconductor element may be a p-type phase change material, such as $Ge_2Sb_2Te_5$. According to an example embodiment, the thermoelectric element may be formed through a front end of the line (FEOL) integration process. According to another example embodiment, the thermoelectric element may be formed after a back end of the line (BEOL) process.

According to at least some example embodiments, the method may further include: supplying the operation voltage to the p-type semiconductor element performing a photoelectric conversion during the photoelectric conversion operation. A path through which the operation voltage is supplied to the p-type semiconductor element during the photo-electric conversion operation may be different from a path through which the operation voltage is supplied to the p-type semiconductor element during the reset operation.

The method may further include: performing a photo-electric conversion using the p-type semiconductor element during the photo-electric conversion operation.

The method may further include: transmitting (e.g., directly transmitting) charges generated from the p-type semiconductor element to a floating diffusion node during the photo-electric conversion operation.

The method may further include: supplying the voltage to the n-type semiconductor element during reading out of a pixel signal generated based on the charges.

At least one other example embodiment of the present inventive concepts is directed to an image sensor. According to at least this example embodiment, the image sensor includes: a pixel including a thermoelectric element having a thermoelectric-junction; and a readout circuit configured to control the pixel so that the thermoelectric element performs a thermoelectric-cooling operation and a photoelectric conversion operation on the pixel.

The thermoelectric element may be a Peltier element including an n-type semiconductor element and a p-type semiconductor element, which form a Peltier-junction. According to at least one example embodiment, the image sensor may be a complementary metal oxide semiconductor (CMOS) image sensor for front side illumination (FSI). According to another example embodiment, the image sensor may be a CMOS image sensor for back side illumination (BSI).

At least one other example embodiment of the present inventive concepts is directed to an image processing device. According to at least this example embodiment, the image processing device includes: an image sensor and a control circuit configured to control operation of the image sensor. The image sensor includes: a pixel including a thermoelectric element having a thermoelectric-junction; and a readout circuit configured to control the pixel so that the thermoelectric element may perform a thermoelectric-cooling operation and a photoelectric conversion operation on the pixel.

The thermoelectric element may be a Peltier element including an n-type semiconductor element and a p-type semiconductor element, which form a Peltier-junction. While a first voltage is supplied to the n-type semiconductor element, the readout circuit may supply an operation voltage, which is higher than the first voltage, to the p-type semiconductor element during a reset operation.

The readout circuit may be configured to: transmit (e.g., directly transmit) charges generated by the p-type semiconductor element to a floating diffusion node during the photo-electric conversion operation; and supply the voltage to the n-type semiconductor element during a readout operation.

A portable electronic device according to an example embodiment of the present inventive concepts includes: an image processing device; a processor configured to control operation of the image processing device; and a display configured to display image data processed by the image processing device. The image processing device includes: an image sensor and a control circuit configured to control operation of the image sensor. The image sensor includes: a pixel including a thermoelectric element having a thermoelectric-junction; and a readout circuit configured to control the pixel so that the thermoelectric element may perform a thermoelectric-cooling operation and a photoelectric conversion operation on the pixel.

At least one other example embodiment of present inventive concepts provides an image sensor pixel including: a thermoelectric element configured to thermoelectrically cool the pixel, and to perform photoelectric conversion operation.

According to at least some example embodiments, the thermoelectric element may include: a thermoelectric-junction configured to perform the thermoelectric cooling of the pixel; and a photoelectric conversion portion configured to perform the photoelectric conversion operation.

The thermoelectric junction may be Peltier-junction. The photoelectric conversion portion may be a phase change material. The thermoelectric element may be configured to: thermoelectrically cool the pixel during a reset operation; and perform the photoelectric conversion operation during an integration operation.

At least one other example embodiment of present inventive concepts provides an image sensor including: a readout circuit configured to concurrently perform a thermal reset operation and an electrical reset operation on a pixel of the image sensor during a reset interval.

The readout circuit may be configured to: apply a thermal reset voltage to the pixel to perform the thermal reset operation, and apply an electrical reset voltage to the pixel to perform the electrical reset operation. The electrical reset voltage and the thermal reset voltage may be applied to the pixel concurrently.

The electrical reset voltage may be greater than the thermal reset voltage.

According to at least some example embodiments, the image sensor may further include: a pixel having a thermoelectric-element configured to: thermoelectrically cool the pixel, and perform photoelectric conversion operation.

The thermoelectric-element may further include: a thermoelectric-junction configured to perform the thermoelectric cooling of the pixel; and a photoelectric conversion portion configured to perform the photoelectric conversion operation

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
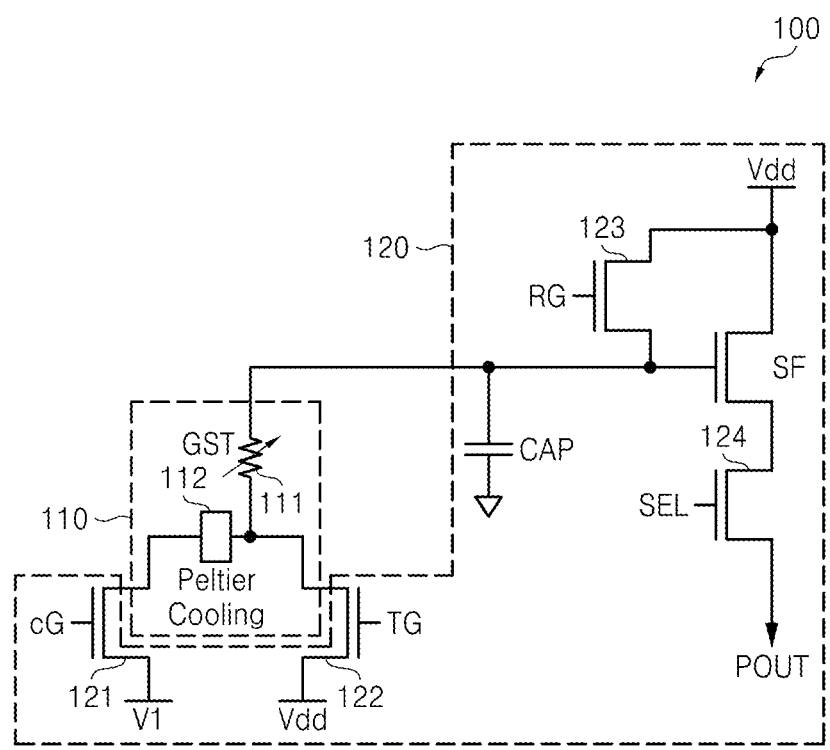
FIG. 1 is a CMOS image sensor including a pixel having a thermoelectric element and a readout circuit according to an example embodiment of the present inventive concepts.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a CMOS image sensor including a pixel having a thermoelectric element and a readout circuit according to an example embodiment of the present inventive concepts.

Referring to FIG. 1, a CMOS image sensor 100 includes a pixel 110 and a readout circuit 120. For example, the pixel 110 and the readout circuit 120 may configure a unit pixel of a pixel array.

The pixel 110 may be thermoelectrically cooled on a pixel 110 using a thermoelectric device or thermoelectric element having thermoelectric-junction.

The thermoelectric element denotes an element that directly converts temperature differences into a voltage using a thermoelectric effect or directly converts voltage differences into temperature using the thermoelectric effect.

The thermoelectric effect includes Peltier effect, Seebak effect, and Thomson effect.

According to the thermoelectric effect, thermoelectric-cooling or thermoelectric-heating is performed on a junction of two different materials (this is called 'thermoelectric-junction').

The thermoelectric-effect may occur in the thermoelectric-junction, or an electrode connected to each of the materials. A direction of the thermoelectric-cooling and the thermoelectric-heating is determined based on polarities of voltages supplied to the materials or a difference between the voltages. That is, the thermoelectric-cooling and thermoelectric-heating use a thermoelectric effect generating heat flux between thermoelectric junctions.

As an example of the thermoelectric-cooling in the present inventive concepts, a process that performs Peltier-cooling on the pixel 110 using a Peltier-element having a Peltier-junction is described in detail; however, a technical concept of the present inventive concepts is not restricted thereto.

As described above, the Peltier-junction denotes a junction which may show Peltier-effect, and the Peltier-cooling denotes cooling using the Peltier-effect.

The pixel 110 includes a p-type semiconductor element 111 and an n-type semiconductor element 112 which form a thermoelectric-junction. For example, the p-type semiconductor element 111 and the n-type semiconductor element 112 which form the thermoelectric-junction may be connected to each other through an electric conductor such as metal.

The p-type semiconductor element 111 may be embodied in a p-type phase change material, e.g., GST, and more specifically, in $Ge_2Sb_2Te_5$. The thermoelectric-junction is totally different from a p-n junction of a p-n diode in characteristics.

The readout circuit 120 controls or is controlled so that a thermoelectric element formed inside the pixel 110 may perform a thermoelectric-cooling operation and a photoelectric conversion operation on the pixel 110 during a reset operation. The thermoelectric element forming a thermoelectric-junction may be embodied in the p-type semiconductor element 111 and the n-type semiconductor element 112. For example, the Peltier element includes the p-type semiconductor element 111 and the n-type semiconductor element 112.

The readout circuit 120 includes a first switch 121 supplying a first voltage V1 to the n-type semiconductor element 112 in response to a first control signal cG, and a second switch 122 supplying an operation voltage Vdd to the p-type semiconductor element 111 in response to a second control signal TG. The first voltage V1 is lower than the operation voltage Vdd.

The readout circuit 120 further includes a reset switch 123, a source follower SF, and a selection switch 124. Each component 121, 122, 123, SF, and 124 may be embodied in MOSFET.

The reset switch 123 supplies the operation voltage Vdd to a gate of the source follower SF in response to a reset signal RG. The source follower SF transmits a voltage corresponding to the operation voltage Vdd to the selection switch 124 based on a voltage of the gate. The selection switch 124 outputs a pixel signal POUT corresponding to charges generated by the pixel 110 in response to a selection signal SEL.

A capacitor CAP is formed in between a gate of the source follower SF and a ground. The capacitor CAP may perform a function of a floating diffusion node. In this case, the capacitor CAP may be a modeling of the floating diffusion node storing charges generated from the p-type semiconductor element 111.

Figure 2:
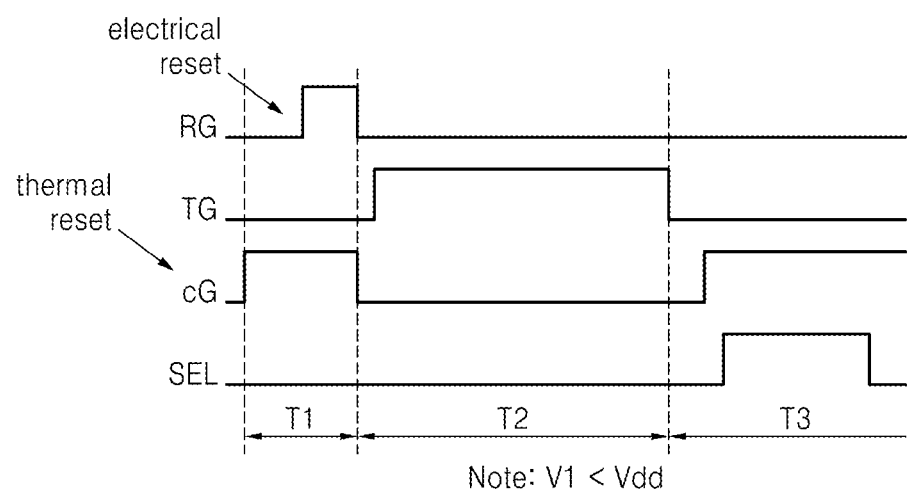
FIG. 2 is a timing diagram of control signals related to example operation of the readout circuit of FIG. 1.

FIG. 2 is an example timing diagram of control signals related to example operation of the readout circuit of FIG. 1.

Referring to FIGS. 1 and 2, a first voltage V1 is supplied to the n-type semiconductor element 112 forming a thermoelectric-junction, e.g., Peltier-junction, through a first switch 121 for a thermoelectric reset in a first section T1, e.g., a reset operation. While the first voltage V1 is supplied to the n-type semiconductor element 112, a voltage Vdd higher than the first voltage V1 is supplied to the p-type semiconductor element 111 through the reset switch 123 for an electric reset. As discussed herein, the first voltage V1 may be referred to as the thermal or thermoelectric reset voltage, and the voltage Vdd may be referred to as the electric or electrical reset voltage.

During a second section T2, e.g., during a charge transmission operation or a photoelectric conversion operation, a second control signal TG maintains a high level.

Accordingly, the operation voltage Vdd is supplied to the p-type semiconductor element 111 through a second switch 122. Here, the p-type semiconductor element 111 may perform a function of a photo detector, a photoelectric conversion operation may be performed by the p-type semiconductor element 111.

During a third section T3, when the pixel signal POUT is readout, a selection signal SEL transitions to the logic high level and a first control signal cG transitions to a high level. Accordingly, a first voltage V1 is supplied to the n-type semiconductor element 112 through the first switch 121.

Figure 3:
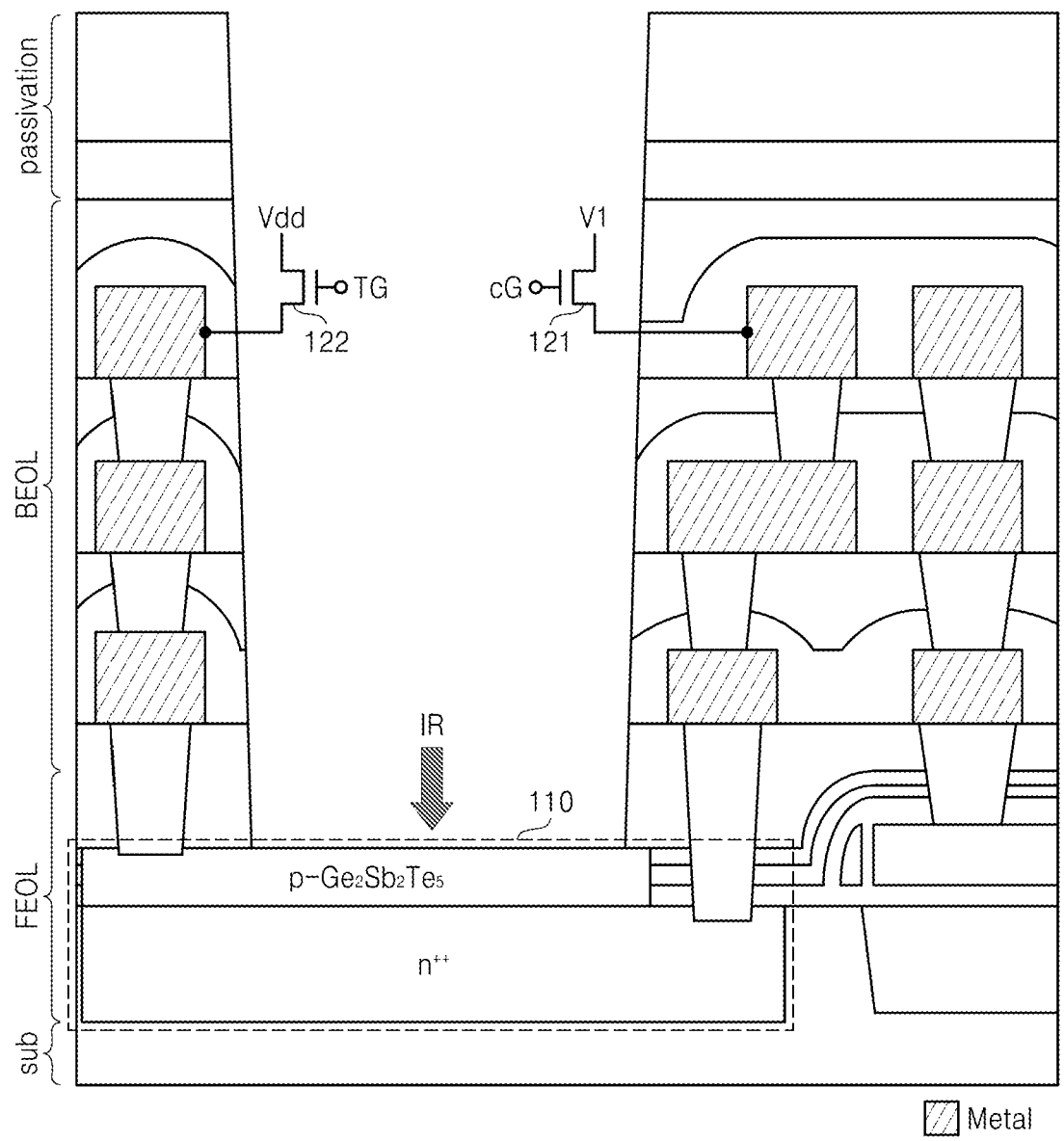
FIG. 3 is a cross-sectional view of an example front end of the line (FEOL) integration-front side illumination (FSI) complementary metal oxide semiconductor (CMOS) image sensor including a portion of the pixel and the readout circuit of FIG. 1.

FIG. 3 is a cross-sectional view of an example complementary metal oxides semiconductors (CMOS) image sensor for front end of the line (FEOL) integration front side illumination (FSI) including a portion of the pixel and the readout circuit of FIG. 1.

Referring to FIGS. 1 to 3, an n-type semiconductor element $n^{++}$ is formed on or on a substrate sub, and a p-type semiconductor element, e.g., p-type $Ge_2Sb_2Te_5p\text{-}Ge_2Sb_2Te_5$, is formed on the n-type semiconductor element $n^{++}$ in order to form a thermoelectric-junction.

Here, the n-type semiconductor element $n^{++}$ and the p-type semiconductor element $p\text{-}Ge_2Sb_2Te_5$ are formed through a FEOL process. Thereafter, metals and/or contacts are formed through a BEOL process, and a passivation process is performed.

During the reset operation T1, the first switch 121 turned on in response to the first control signal cG supplies a first voltage V1 to the n-type semiconductor element $n^{++}$ through metals and/or contacts, and the second switch 122 turned on in response to the second control signal TG supplies an operation voltage Vdd to the p-type semiconductor element p-$Ge_2Sb_2Te_5$ through the metals and/or contacts while a first voltage V1 is supplied to the n-type semiconductor element $n^{++}$. Accordingly, in a thermoelectric-junction, e.g., a junction between the n-type semiconductor element $n^{++}$ and the p-type semiconductor element p-$Ge_2Sb_2Te_5$, thermoelectric-cooling, e.g., Peltier-cooling, is performed.

Figure 4:
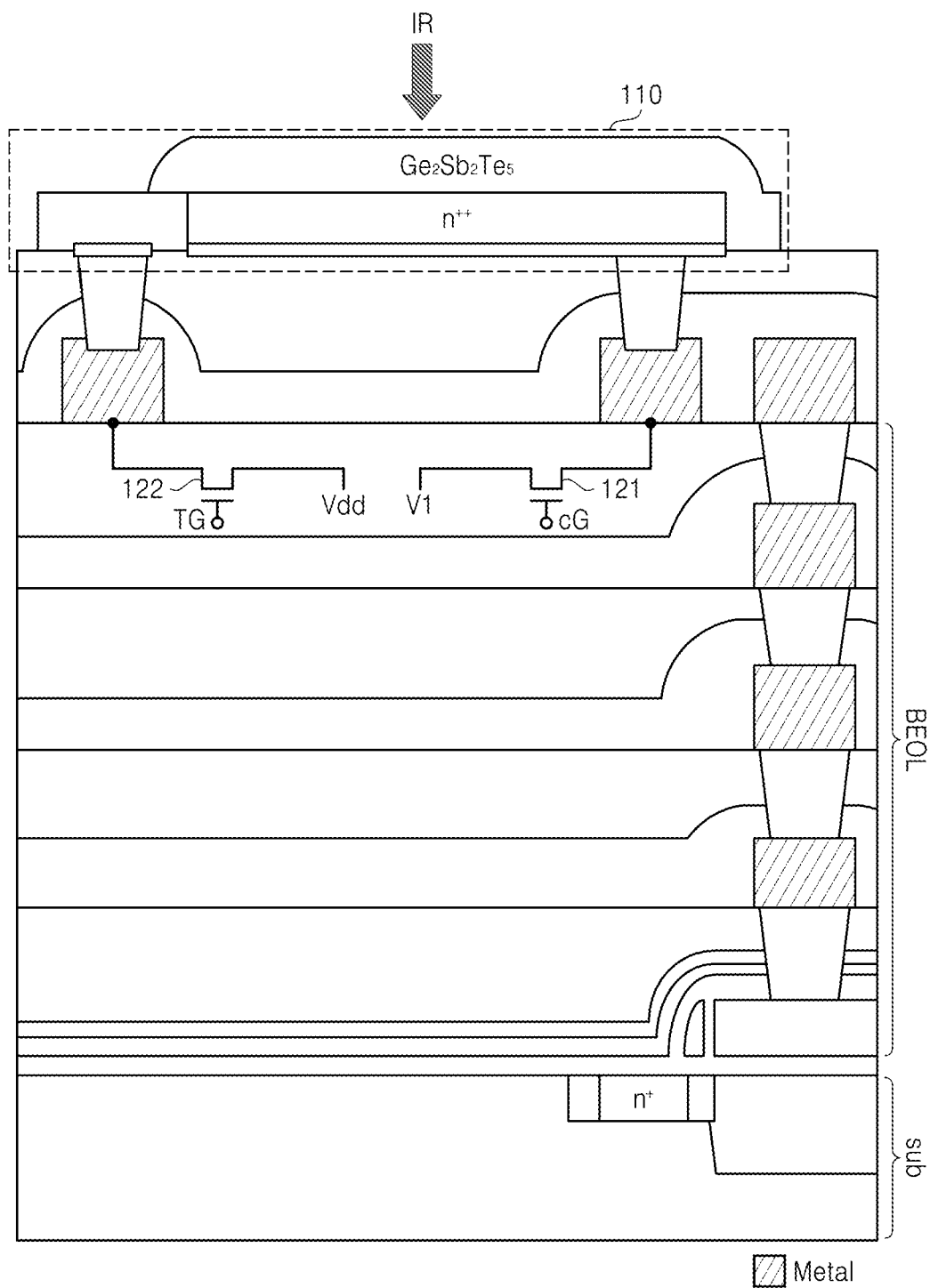
FIG. 4 is across-sectional view of an example back end of the line (BEOL) integration-FSI CMOS image sensor including a portion of the pixel and the readout circuit of FIG. 1.

FIG. 4 is a cross-sectional diagram of an example CMOS image sensor for back end of the line (BEOL) integration front side illumination (FSI) including a portion of the pixel and the readout circuit of FIG. 1.

Referring to FIGS. 1, 2, and 4, the n-type semiconductor element $n^{++}$ is formed after the BEOL process, and the p-type semiconductor element, e.g., the p-type $Ge_2Sb_2Te_5$ p-$Ge_2Sb_2Te_5$, is formed in order to form a thermoelectric-junction on the n-type semiconductor element $n^{++}$.

During the reset operation T1, the first switch 121 turned on in response to the first control signal cG supplies the first voltage V1 to the n-type semiconductor element $n^{++}$ through metals and/or contacts, and the second switch 122 turned on in response to the second control signal TG supplies the operation voltage Vdd to the p-type semiconductor element p-$Ge_2Sb_2Te_5$ through the metals and/or contacts while the first voltage V1 is supplied to the n-type semiconductor element $n^{++}$.

Accordingly, in a thermoelectric-junction, e.g., a junction between the n-type semiconductor element $n^{++}$ and the p-type semiconductor element p-$Ge_2Sb_2Te_5$, thermoelectric-cooling, e.g., Peltier-cooling, is performed.

Figure 5:
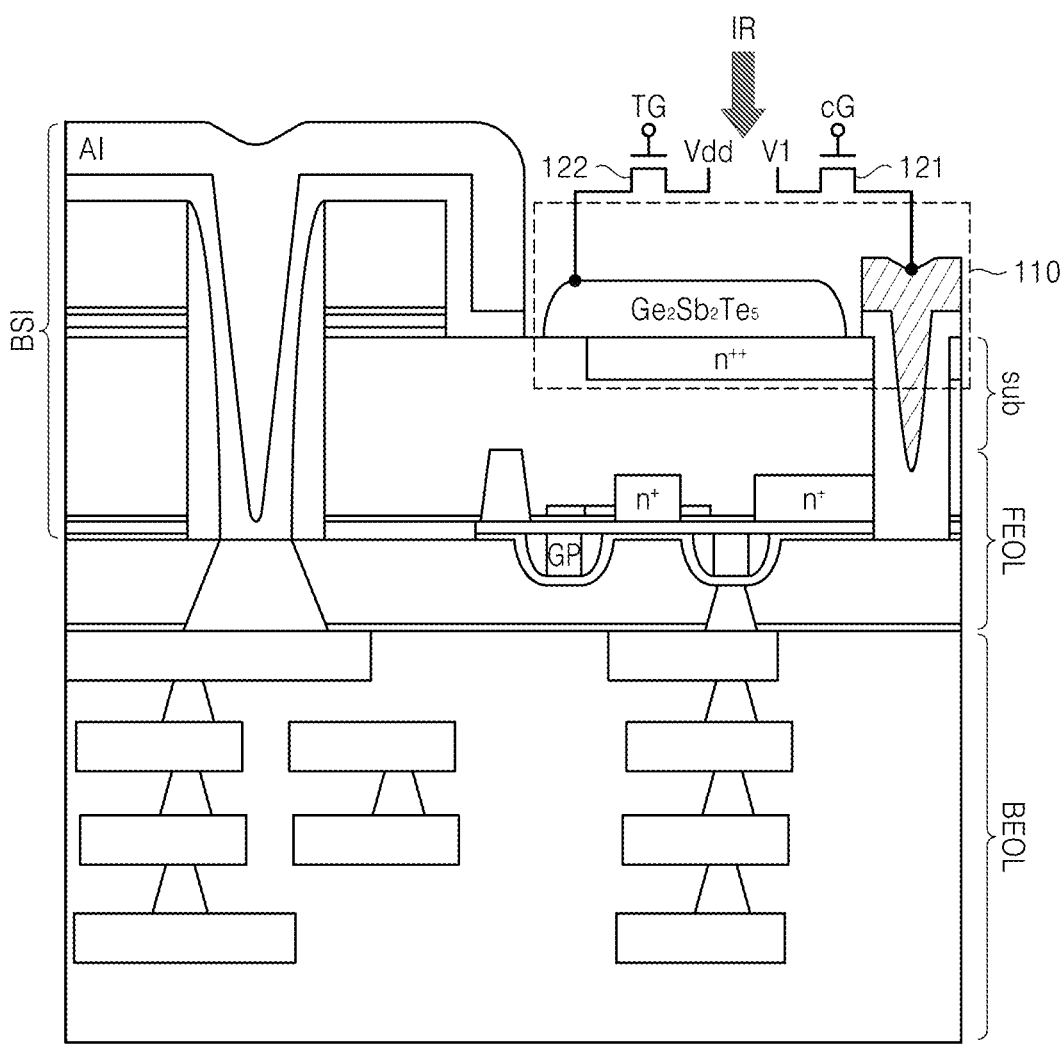
FIG. 5 is a cross-sectional view of an example back side illumination (BSI) CMOS image sensor including a portion of the pixel and the readout circuit of FIG. 1.

FIG. 5 is a cross-sectional diagram of an example CMOS image sensor for back side illumination (BSI) including a portion of the pixel and the readout circuit of FIG. 1.

Referring to FIGS. 1, 2, and 5, the n-type semiconductor element $n^{++}$ is formed on or in a substrate sub, and the p-type semiconductor element, e.g., the p-type $Ge_2Sb_2Te_5$ p-$Ge_2Sb_2Te_5$, is formed in order to form a thermoelectric junction on the n-type semiconductor element $n^{++}$.

During the reset operation T1, the first switch 121 turned on in response to the first control signal cG supplies the first voltage V1 to the n-type semiconductor element $n^{++}$, and the second switch 122 turned on in response to the second control signal TG supplies the operation voltage Vdd to the p-type semiconductor element p-$Ge_2Sb_2Te_5$ while the first voltage V1 is supplied to the n-type semiconductor element $n^{++}$.

Accordingly, in a thermoelectric-junction, e.g., a junction between the n-type semiconductor element $n^{++}$ and the p-type semiconductor element p-$Ge_2Sb_2Te_5$, thermoelectric-cooling, e.g., Peltier-cooling, is performed.

In FIGS. 3 to 5, IR denotes incident light incident on the pixel 100, e.g., visible light or infrared light. Moreover, as illustrated in FIGS. 3 to 5, the n-type semiconductor element $n^{++}$ and the p-type semiconductor element p-$Ge_2Sb_2Te_5$ are integrated inside the pixel 110, so that an additional thermoelectric element is not necessary.

Figure 6:
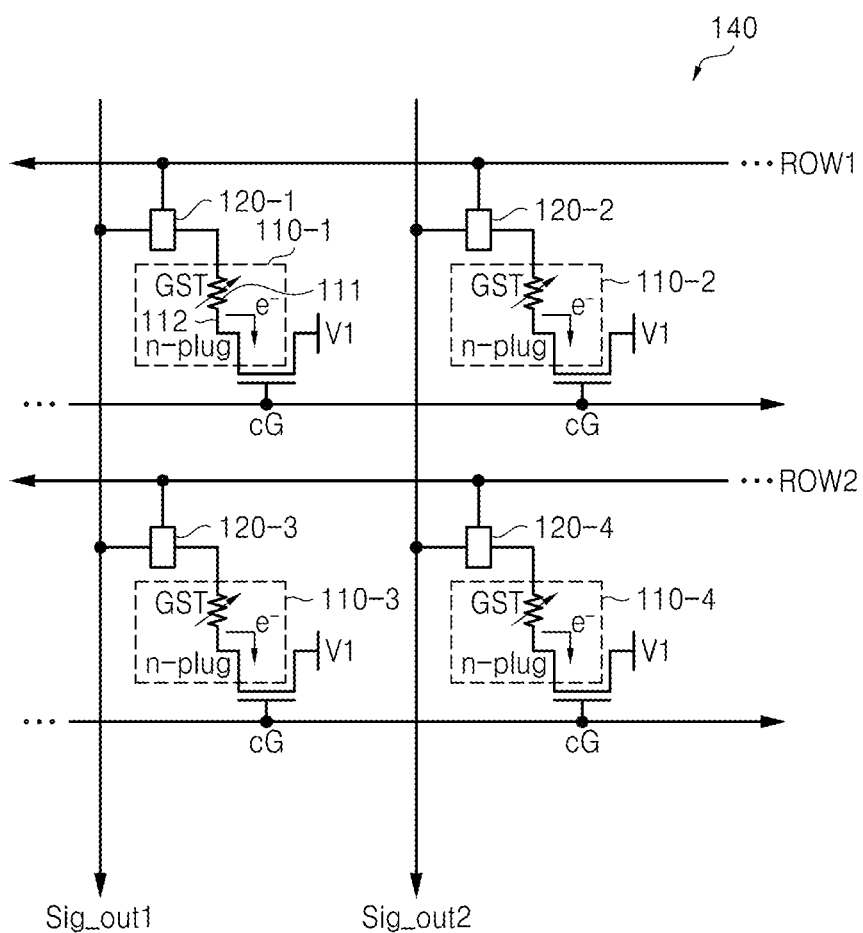
FIG. 6 is an example embodiment of a CMOS image sensor including a pixel array where pixels performing thermoelectric-cooling are integrated.

FIG. 6 is an example CMOS image sensor including a pixel array where pixels performing thermoelectric-cooling are integrated.

Referring to FIG. 6, a pixel array 140 includes a plurality of pixels 110-1 to 110-4 and a plurality of readout circuits 120-1 to 120-4. For convenience of description in FIG. 6, a CMOS image sensor including the four pixels 110-1 to 110-4 and the four readout circuits 120-1 to 120-4 is illustrated; however, the present inventive concept is not restricted thereto.

Each structure of the four pixels 110-1 to 110-4 is substantially the same as a structure of each pixel 110 described referring to FIGS. 3 to 5. Here, 'substantially the same' denotes 'totally the same' or 'the same in a deviation range'. Here, the n-type semiconductor element 112 may be referred to as an n-plug. Electrons supplied from the p-type semiconductor element 111, e.g., GST, may be supplied to an n-plug 112.

A pixel signal Sig_out1 and Sig_out2 output from each of the plurality of pixels 110-1 to 110-4 may be output through each column in response to a plurality of control signals. Moreover, corresponding first switches embodied in a corresponding row ROW1 and ROW2 may supply the first voltage V1 to a corresponding n-plug 112 in response to a corresponding first control signal cG.

Figure 7:
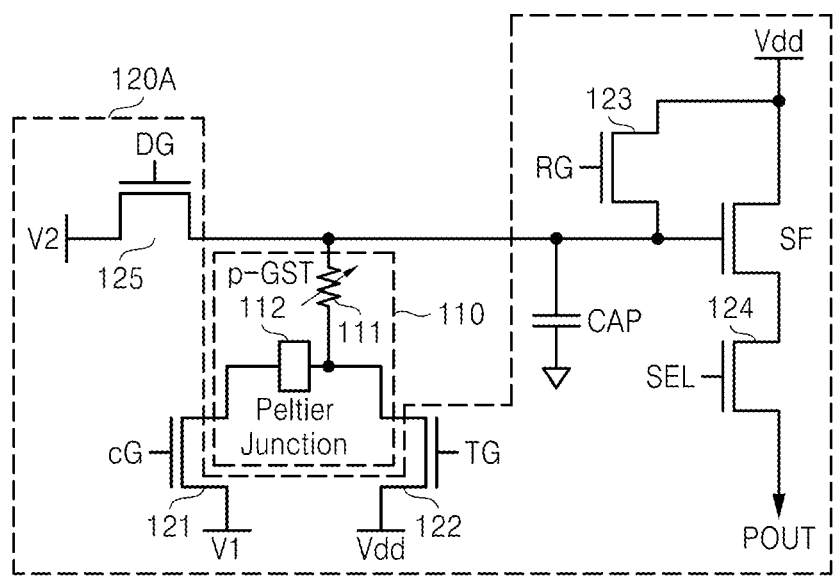
FIG. 7 is an example embodiment of a CMOS image sensor including the pixel included in the pixel array and the readout circuit illustrated in FIG. 6.

FIG. 7 is an example CMOS image sensor including the pixel included in the pixel array and the readout circuit illustrated in FIG. 6.

Except for a third switch 125 supplying a second voltage V2 to the p-type semiconductor element 111 based on a third control signal DG, a structure and an operation of the readout circuit 120 in FIG. 1 are substantially the same as a structure and an operation of the readout circuit 120A in FIG. 7.

Each of the plurality of readout circuit 120-1 to 120-4 may be embodied in the readout circuit 120 of FIG. 1 or the readout circuit 120A of FIG. 7.

Figure 8:
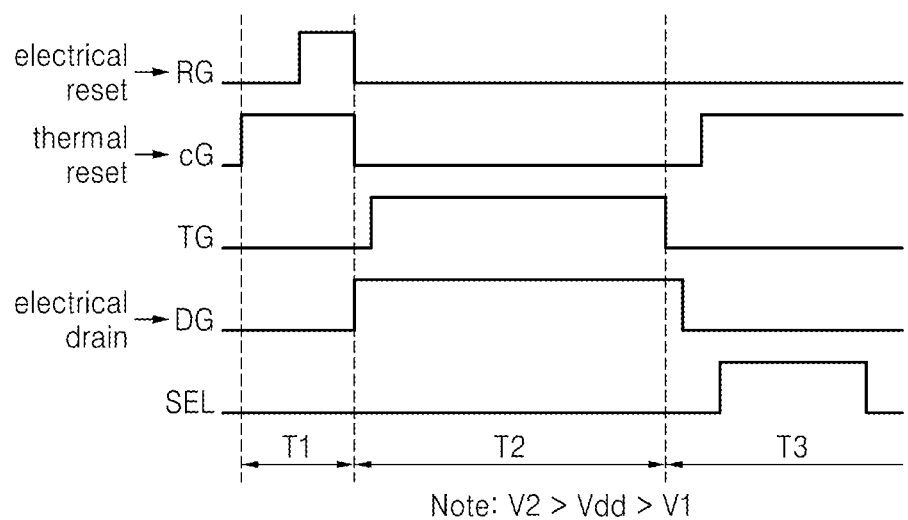
FIG. 8 is an example timing diagram of control signals related to example operation of the readout circuit illustrated in FIG. 7.

FIG. 8 is an example timing diagram of control signals related to example operation of the readout circuit illustrated in FIG. 7.

Referring to FIGS. 7 and 8, a first control signal cG transitions first to a high level for a thermoelectric reset, and a reset signal RG transitions to the high level for an electric reset during a first interval T1.

During a second interval T2, a third control signal DG transmits first to a high level prior to a second control signal TG for an electrical drain. Accordingly, the third switch 125 supplies a second voltage V2 to the p-type semiconductor element 111 in response to the third control signal DG. Here, the second voltage V2 is higher than the operation voltage Vdd.

Figure 9:
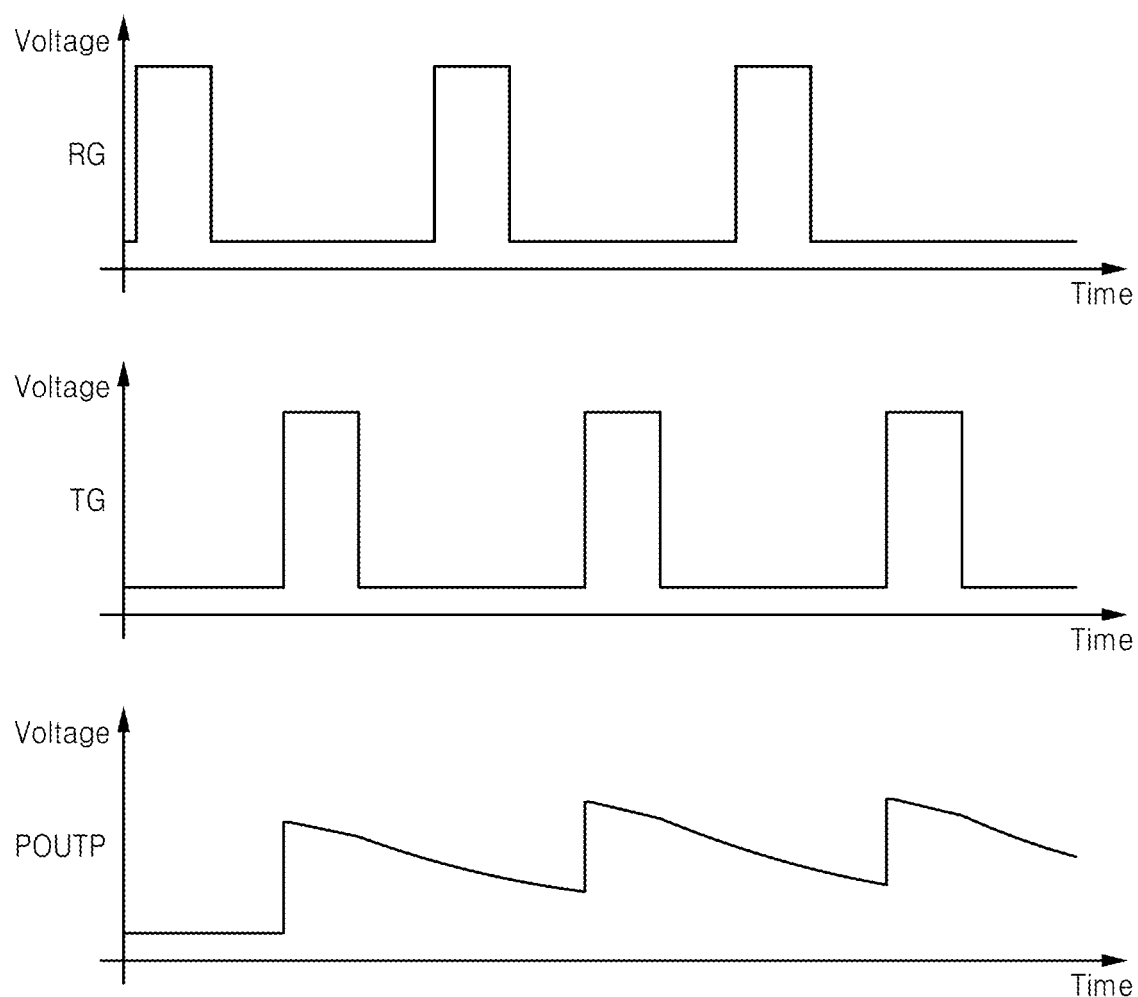
FIG. 9 is an example waveform diagram of signals in a conventional readout circuit connected to a conventional pixel without thermoelectric-cooling.

FIG. 9 is an example waveform diagram of signals in a conventional readout circuit connected to a conventional pixel without thermoelectric-cooling.

Figure 10:
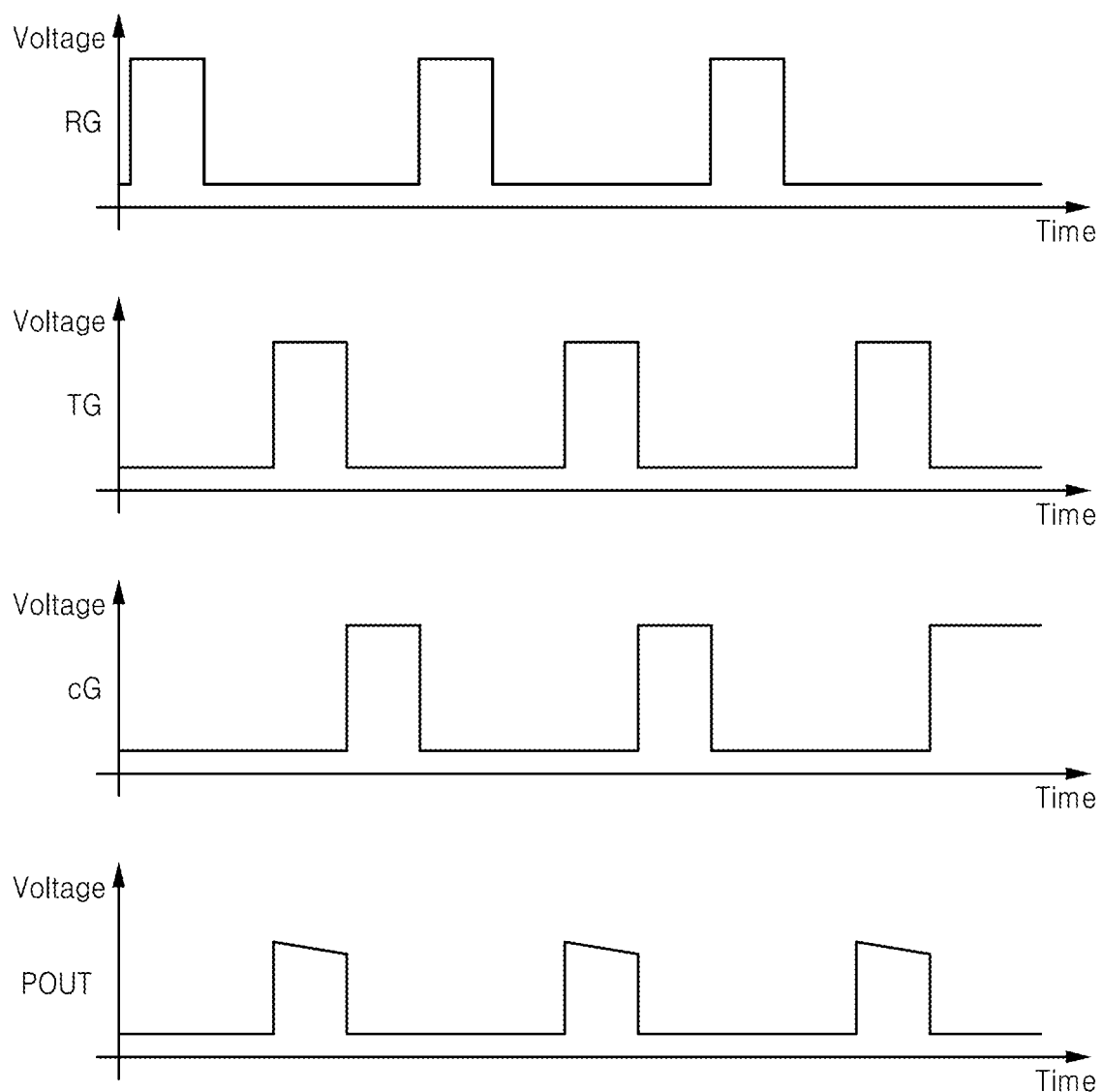
FIG. 10 is an example waveform diagram of signals in a readout circuit according to an example embodiment of the present inventive concepts, which is connected to a pixel performing thermoelectric-cooling.

FIG. 10 is an example waveform diagram of signals in a readout circuit according to an example embodiment of the present inventive concepts, which is connected to a pixel that performs thermoelectric-cooling.

FIG. 9 shows a pixel signal POUTP outputting from a corresponding readout circuit when the n-type semiconductor element 112 and the first switch 121 are not embodied, and FIG. 10 shows a pixel signal POUT output from a corresponding readout circuit 120 or 120A when the n-type semiconductor element 112 and the first switch 121 are embodied.

Referring to FIG. 9, since a thermoelectric reset is not performed, the pixel signal POUTP is not totally reset during a reset operation. However, referring to FIG. 10, since the thermoelectric reset is performed in the pixel 110 according to the first control signal cG, a pixel signal POUT is almost completely reset during the reset operation.

Figure 11:
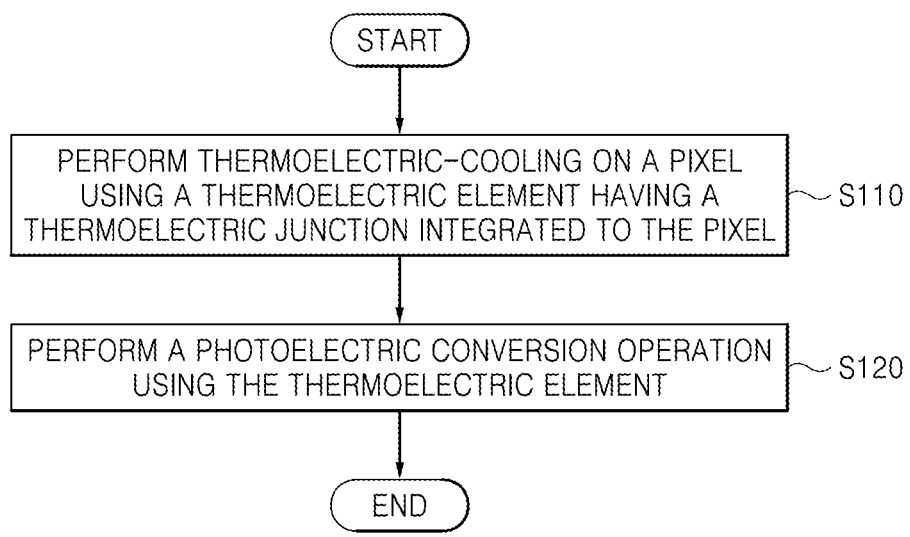
FIG. 11 is a flowchart for describing example operation of a CMOS image sensor according to an example embodiment of the present inventive concepts.

FIG. 11 is a flowchart for describing example operation of a CMOS image sensor according to an example embodiment of the present inventive concepts.

Referring to FIGS. 1 to 8, and 11, the pixel 110 is thermoelectric-cooled using a thermoelectric element, e.g., Peltier element, having a thermoelectric-junction, e.g., Peltier-junction, integrated to the pixel 110 during the reset operation T1 (S110). And then, during the photoelectric conversion operation T2, a photoelectric conversion operation is performed using at least a portion of the thermoelectric element (S120).

Figure 12:
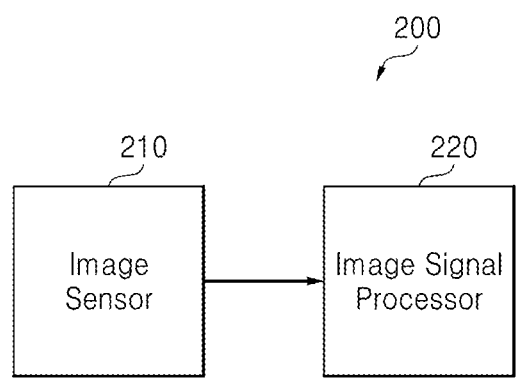
FIG. 12 is a block diagram illustrating an image processing device including an CMOS image sensor according to an example embodiment of the present inventive concepts.

FIG. 12 is a block diagram illustrating an image processing device including a CMOS image sensor according to an example embodiment of the present inventive concepts. Referring to FIG. 12, an image processing device 200 includes a CMOS image sensor 210 and an image signal processor 220.

The CMOS image sensor 210 includes the pixel 110 and the readout circuit 120 of FIG. 1, or includes the pixel array 140 illustrated in FIG. 6. That is, the CMOS image sensor 210 may perform a thermoelectric-cooling operation and a photoelectric conversion operation using a thermoelectric element having a thermoelectric-junction.

The image signal processor 220 may process an image signal output from the CMOS image sensor 210. The CMOS image sensor 210 and the image signal processor 220 may be embodied in one package, e.g., a multi-chip package or system in package (SiP).

Figure 13:
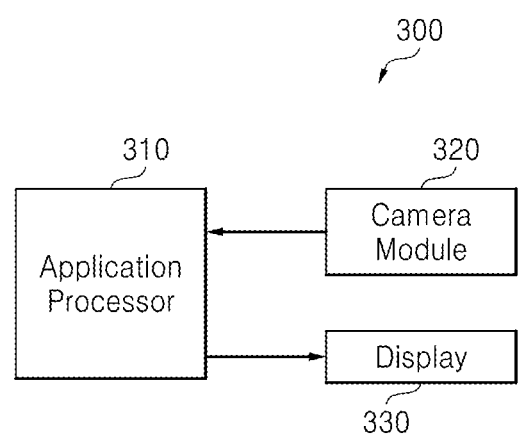
FIG. 13 is a block diagram illustrating another image processing device including a CMOS image sensor according to another example embodiment of the present inventive concepts.

FIG. 13 is a block diagram illustrating another image processing device including a CMOS image sensor according to an example embodiment of the present inventive concepts.

Referring to FIG. 13, an image processing device 300 includes an application processor 310, a camera module 320, and a display 330. The image processing device 300 may be a portable electronic device, e.g., a smart phone, a tablet personal computer (PC) or mobile internet device (MID).

When the camera module 320 includes only the CMOS image sensor 210 illustrated in FIG. 12, the application processor 310 may perform an image signal processing function processing an image signal output from the camera module 320. Here, the image signal processing function may be the same as a function performed in the image signal processor 220 in FIG. 12.

When the camera module 320 is the image processing device 200 including the CMOS image sensor 210 and the image signal processor 220 illustrated in FIG. 12, the application processor 310 may process an image signal processed by the image signal processor 220.

Here, the application processor 310 may perform a function of a control circuit or a processor controlling an operation of the CMOS image sensor included in the camera module 320.

According to a control of the application processor 310, the display 330 may display image data output from the camera module 320.

Figure 14:
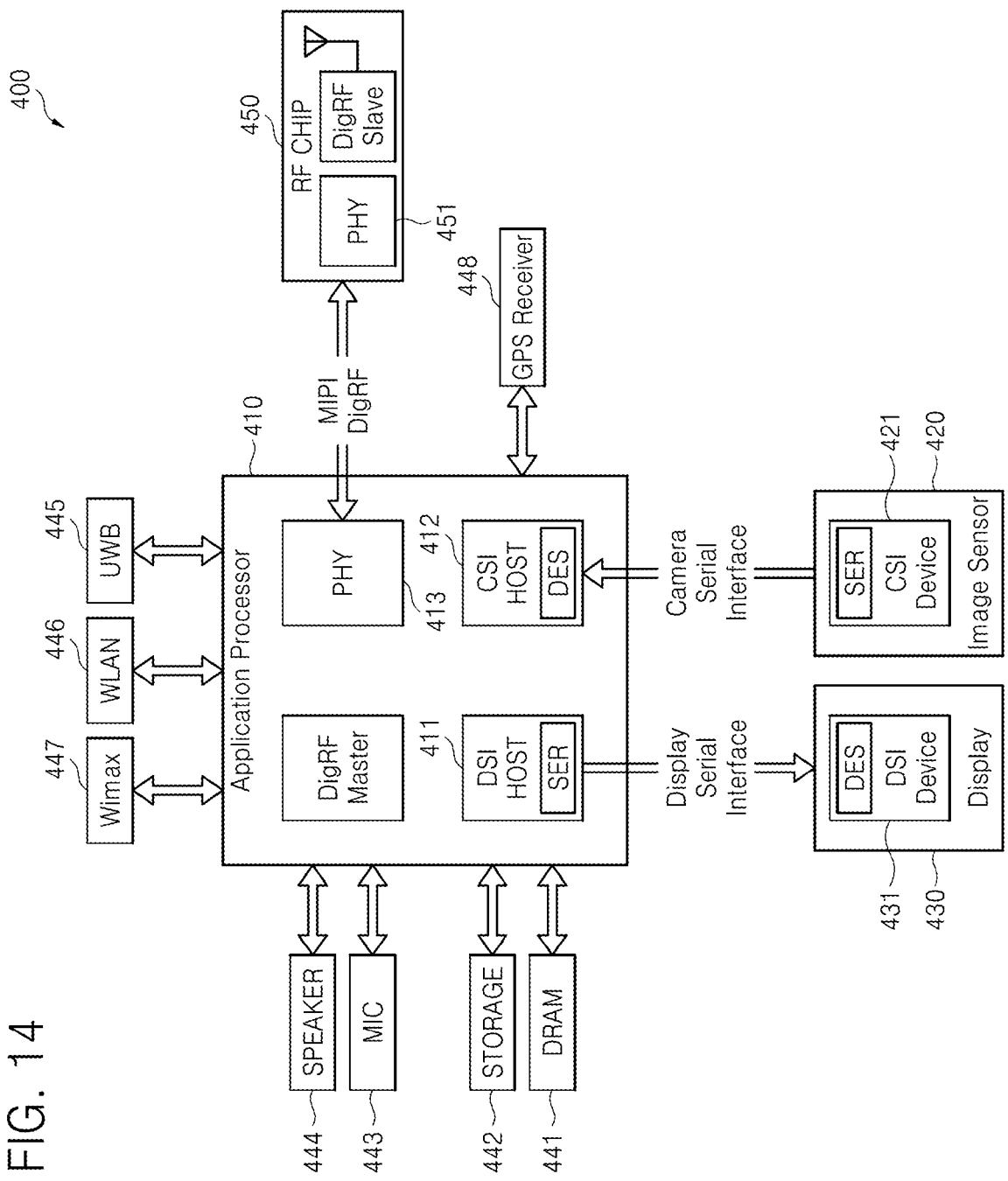
FIG. 14 is a block diagram of a portable electronic device including a CMOS image sensor according to still another example embodiment of the present inventive concepts.

FIG. 14 is a block diagram of a portable electronic device including a CMOS image sensor according to still another example embodiment of the present inventive concepts. Referring to FIGS. 1 and 14, a portable electronic device 400 may include an application processor 410, an image sensor 420, a display 430, and a memory 441.

The portable electronic device 400 may be embodied in a laptop computer, a mobile phone, a smart phone, a tablet PC, a personal digital assistant (PDA), an enterprise digital assistant (EDA), a portable multimedia player (PMP), an MID, or an e-book. For example, the portable electronic device 400 may be a communication device which may support a mobile industry processor interface (MIPI®).

The application processor 410 may control an operation of the CMOS image sensor 420, the display 430, and the memory 441.

A camera serial interface (CSI) host 412 embodied in the application processor 410 may perform a serial communication with a CSI device 421 of the CMOS image sensor 420 through a display serial interface. According to an example embodiment, a deserializer DES may be embodied in the CSI host 412, and a serializer SER may be embodied in the CSI device 421.

The CMOS image sensor 420 includes the pixel 110 which may perform thermoelectric-cooling and a photoelectric conversion operation. A display serial interface (DSI) host 411 embodied in the application processor 410 may perform a serial communication with a DSI device 431 of the display 430 through a display serial interface. According to an example embodiment, a serializer SER may be embodied in the DSI host 411, and a deserializer DES may be embodied in the DSI device 431.

The portable electronic device 400 may further include a radio frequency (RF) chip 450 which may communicate with the application processor 410. A PHY (physical layer) 413 of the application processor 410 and a PHY 451 of the RF chip 45 may transmit and receive data each other according to a communication protocol, e.g., MIPI DigRF. The application processors 410 may store data processed by the CMOS image sensor 420 in the memory 441.

The portable electronic device 400 may further include a data storage device 442 which is embodied in a non-volatile memory such as a NAND flash memory, a mike 443, or a speaker 444.

The data storage device 442 may be an external memory, e.g., an embedded multimedia card (eMMC) or a universal flash storage (UFS).

The portable electronic device 400 may communicate with an external communication device using at least one communication protocol or communication standard, e.g., an ultra-wideband (UWB) 445, a wireless local area network (WLAN) 446, a worldwide interoperability for microwave access (WiMAX) 447, or a long term evolution (LTE™). The portable electronic device 400 may further include a global positioning system (GPS) receiver 448.

Figure 15:
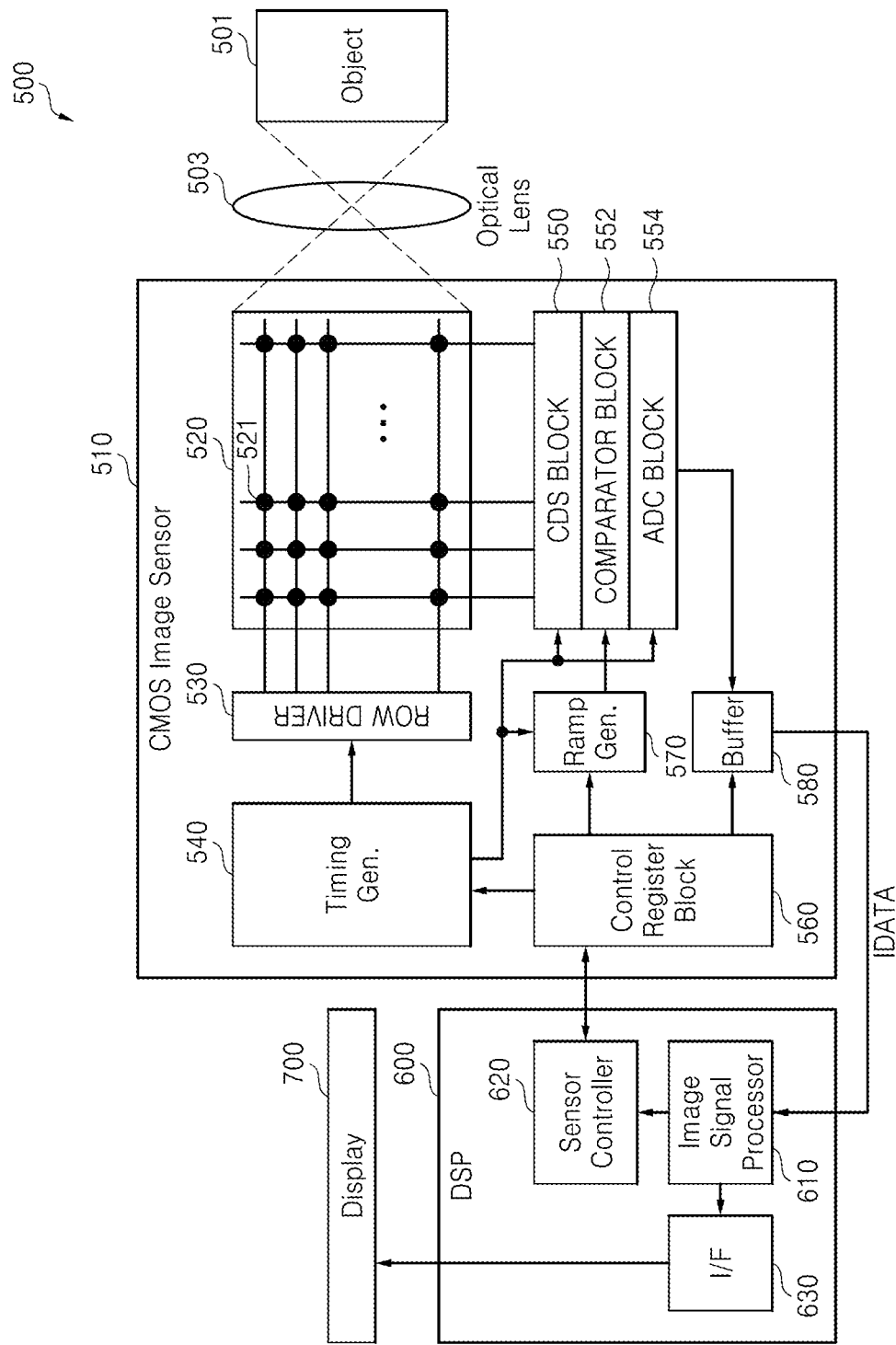
FIG. 15 is a block diagram of the portable electronic device including a CMOS image sensor according to still another example embodiment of the present inventive concepts.

FIG. 15 is a block diagram of a portable electronic device including a CMOS image sensor according to still another example embodiment of the present inventive concepts. Referring to FIG. 15, a portable electronic device 500 may be embodied in a digital camera, a smart phone, or a tablet personal computer (PC).

The portable electronic device 500 includes an optical lens 503, a CMOS image sensor 510, a digital signal processor (DSP) 600, and a display 700.

The CMOS image sensor 510 generates image data IDATA for an object 501 or a scene incident through the optical lens 503. The CMOS image sensor 510 includes a pixel array 520, a row driver 530, a timing generator 540, a correlated double sampling (CDS) block 550, a comparator block 552, an analog-to-digital converter (ADC) block 554, a control register block 560, a ramp signal generator 570, and a buffer 580.

The pixel array 520 includes a plurality of unit pixels 521 arranged in a matrix form. As described referring to FIGS. 1 to 8, each of the plurality of unit pixels 521 includes the pixel 110 and the readout circuit 120. That is, the pixel 110 may perform thermoelectric-cooling and a photoelectric conversion operation.

The row driver 530 supplies a plurality of control signals e.g., RG, TG, cG, and SEL for controlling an operation of each of the plurality of unit pixels 521 to the pixel array 520 according to a control of the timing generator 540. According to an example embodiment, the row driver 530 may further include a control signal DG.

The timing generator 540 may control an operation of the row driver 530, the CDS block 550, the ADC block 554, and the ramp signal generator 570 according to a control of the control register block 560.

The CDS block 550 performs CDS on each pixel signal output from each of a plurality of column lines embodied in the pixel array 520. The comparator block 552 compares each of a plurality of correlated double sampled pixel signals output from the CDS block 550 with a ramp signal output from the ramp signal generator 570, and outputs a plurality of comparison signals according to a result of the comparison.

The ADC block 554 converts each of a plurality of comparison signals output from the comparator block 552 into a digital signal, and the buffer 180 stores digital signals output from the ADC block 554.

The control register block 560 controls an operation of at least one of the timing generator 540, the ramp signal generator 570, and the buffer 580 according to a control of the DSP 600. The buffer 580 transmits image data IDATA corresponding to a plurality of digital signals output from the ADC block 554 to the DSP 600.

The DSP 600 includes an image signal processor 610, a CMOS image sensor controller 620, and the display interface 630. The image signal processor 610 controls the display interface 630 and the CMOS image sensor controller 620 controlling the control register block 160. According to an example embodiment, the CMOS image sensor 510 and the DSP 600 may be embodied in one package, e.g., a multi-chip package.

According to another example embodiment, the image sensor 510 and the image signal processor 610 may be embodied in one package, e.g., a multi-chip package.

The image signal processor 610 processes the image data IDATA transmitted from the buffer 580, and transmits the processed image data to the display interface 630. The CMOS image sensor controller 620 generates various control signals for controlling the control register block 160 according to a control of the image signal processor 610.

The display interface 630 transmits image data processed by the image signal processor 610 to a display 700. The display 700 displays image data output from the display interface 630. The display 700 may be embodied in a thin film transistor-liquid crystal display (TFT-LCD), a light emitting diode (LED) display, an organic LED (OLED) display, an active-matrix OLED (AMOLED) display, or a flexible display.

Image sensors according to example embodiments of the present inventive concepts may perform a thermoelectric reset and an electrical reset during a reset operation, so that the image sensors may adapt to changes in temperature.

While inventive concepts have been particularly shown and described with reference to example embodiments thereof, it will be understood by those of ordinary skill in the art that various changes in forms and details may be made therein without departing from the spirit and scope of inventive concepts as defined by the following claims.

What is claimed is:

1. An image sensor comprising:
a pixel including a thermoelectric element having a thermoelectric-junction, the thermoelectric element including an n-type semiconductor element and a p-type semiconductor element, wherein the p-type semiconductor element is a p-type phase change material; and
a readout circuit configured to control the pixel such that the thermoelectric element performs a thermoelectric-cooling operation and a photoelectric conversion operation.

2. The image sensor of claim 1, wherein the thermoelectric element is a Peltier element including the n-type semiconductor element and the p-type semiconductor element that form a Peltier-junction.

3. The image sensor of claim 2, wherein, while a first voltage is supplied to the n-type semiconductor element, the readout circuit is configured to supply an operation voltage to the p-type semiconductor element during a reset operation, the operation voltage being higher than the first voltage.

4. The image sensor of claim 3, wherein the readout circuit is configured to transmit charges generated by the p-type semiconductor element directly to a floating diffusion node during the photoelectric conversion operation, the readout circuit being further configured to supply the first voltage to the n-type semiconductor element during a readout operation.

5. The image sensor of claim 2, wherein the readout circuit comprises:
a first switch configured to supply a first voltage to the n-type semiconductor element in response to a first control signal during a reset operation; and
a reset switch configured to supply an operation voltage to the p-type semiconductor element in response to a reset signal during the reset operation, the operation voltage being higher than the first voltage.

6. The image sensor of claim 5, wherein the p-type semiconductor element is configured to perform photoelectric conversion during the photoelectric conversion operation, and wherein readout circuit further includes,
a second switch configured to supply the operation voltage to the p-type semiconductor element in response to a second control signal during the photoelectric conversion operation.

7. The image sensor of claim 1, wherein the image sensor is a complementary metal-oxide semiconductor (CMOS) image sensor for front side illumination (FSI).

8. The image sensor of claim 1, wherein the image sensor is a CMOS image sensor for back side illumination (BSI).

9. An image processing device comprising:
an image sensor;
a control circuit configured to control operation of the image sensor; and
wherein the image sensor includes,
a pixel including a thermoelectric element having a thermoelectric-junction, the thermoelectric element including an n-type semiconductor element and a p-type semiconductor element, wherein the p-type semiconductor element is a p-type phase change material; and
a readout circuit configured to control the pixel such that the thermoelectric element performs a thermoelectric-cooling operation and a photoelectric conversion operation on the pixel.

10. The image processing device of claim 9, wherein the thermoelectric element is a Peltier element including the n-type semiconductor element and the p-type semiconductor element, that form a Peltier-junction, and wherein the readout circuit is configured to supply an operation voltage to the p-type semiconductor element during a reset operation and while a first voltage is supplied to the n-type semiconductor element, the operation voltage being higher than the first voltage.

11. The image processing device of claim 10, wherein the readout circuit is configured to transmit charges generated by the p-type semiconductor element directly to a floating diffusion node during the photoelectric conversion operation, the readout circuit being further configured to supply the first voltage to the n-type semiconductor element during a readout operation.

12. A portable electronic device comprising:
the image processing device of claim 9;
a processor configured to control operation of the image processing device; and
a display configured to display image data processed by the image processing device.

13. A image sensor pixel comprising:
a thermoelectric element including a thermo-electric junction and a photoelectric conversion portion, the thermoelectric junction configured to thermoelectrically cool the image sensor pixel, and the photoelectric conversion portion configured to perform photoelectric conversion operation, wherein the photoelectric conversion portion is a phase change material.

14. The image sensor pixel of claim 13, wherein the thermoelectric junction is a Peltier-junction.

15. The image sensor pixel of claim 13, wherein the phase change material is $Ge_2Sb_2Te_5$.

16. The image sensor pixel of claim 13, wherein the thermoelectric element is configured to thermoelectrically cool the image sensor pixel during a reset operation and to perform the photoelectric conversion operation during an integration operation.

17. An image sensor comprising:
a pixel including a thermoelectric element, the thermoelectric element including an n-type semiconductor element, a p-type semiconductor element, and a photoelectric conversion portion configured to perform the photoelectric conversion operation; and
a readout circuit configured to apply a thermal reset voltage to the pixel to concurrently perform a thermal reset operation, and an electrical reset operation on the pixel of the image sensor during a reset interval,
wherein, the readout circuit is configured to,
transmit charges generated by the p-type semiconductor element directly to a floating diffusion node during the photoelectric conversion operation, the readout circuit being further configured to supply a first voltage to the n-type semiconductor element during a readout operation.

18. The image sensor of claim 17, wherein the readout circuit is configured to apply an electrical reset voltage to the pixel to perform the electrical reset operation, wherein the electrical reset voltage and the thermal reset voltage are applied to the pixel concurrently.

19. The image sensor of claim 18, wherein the electrical reset voltage is greater than the thermal reset voltage.

20. The image sensor of claim 17, further comprising:
the pixel including the thermoelectric-element configured to thermoelectrically cool the pixel.

21. The image sensor of claim 20, wherein the thermoelectric-element comprises:
a thermoelectric junction configured to thermoelectrically cool the pixel.

* * * * *